United States Patent
Chen (10) Patent No.: US 7,632,745 B2
(45) Date of Patent: Dec. 15, 2009

(54) HYBRID HIGH-K GATE DIELECTRIC FILM

(75) Inventor: George Chen, Los Gatos, CA (US)

(73) Assignee: Intel Corporation, Santa Clara, CA (US)

( * ) Notice: Subject to any disclaimer, the term of this patent is extended or adjusted under 35 U.S.C. 154(b) by 403 days.

(21) Appl. No.: 11/772,164

(22) Filed: Jun. 30, 2007

(65) Prior Publication Data

US 2009/0004881 A1 Jan. 1, 2009

(51) Int. Cl.
*H01L 21/3205* (2006.01)
*H01L 21/4763* (2006.01)

(52) U.S. Cl. .................... 438/591; 438/199; 438/287; 257/E27.108; 257/E21.632; 257/E29.049; 257/E29.052; 257/E29.053

(58) Field of Classification Search .............. 438/199, 438/287, 591, 763, 788, 791, 761; 257/E27.108, 257/E21.632, E29.049, E29.052, E29.053
See application file for complete search history.

(56) References Cited

U.S. PATENT DOCUMENTS

| | | | |
|---|---|---|---|
| 6,867,101 B1 * | 3/2005 | Yu | 438/287 |
| 2003/0194853 A1 * | 10/2003 | Jeon | 438/591 |
| 2005/0272206 A1 * | 12/2005 | Forbes | 438/257 |
| 2006/0019454 A1 * | 1/2006 | Mears et al. | 438/289 |
| 2006/0134870 A1 * | 6/2006 | Luan et al. | 438/287 |
| 2006/0189154 A1 * | 8/2006 | Ahn et al. | 438/763 |
| 2006/0237803 A1 * | 10/2006 | Zhu et al. | 257/410 |
| 2006/0273411 A1 * | 12/2006 | Triyoso et al. | 257/410 |

* cited by examiner

*Primary Examiner*—Michelle Estrada
(74) *Attorney, Agent, or Firm*—Blakely, Sokoloff, Taylor & Zafman LLP (57) ABSTRACT

The present invention discloses a method of forming a gate dielectric film including: providing a channel region in a transistor, the channel region including multiple segments having different sizes, some of which belong to a first surface portion while others belong to a second surface portion wherein the first surface portion and the second surface portion are adjacent; forming a hybrid high-k gate dielectric film over the channel region including: forming a first dielectric material over the first surface portion, the first dielectric material having a sub-monolayer thickness; forming a second dielectric material over the second surface portion, the second dielectric material having a sub-monolayer thickness, and forming a third dielectric film over the first dielectric film and the second dielectric film wherein the third dielectric film is high-k.

12 Claims, 1 Drawing Sheet

HYBRID HIGH-K GATE DIELECTRIC FILM

BACKGROUND OF THE INVENTION

1. Field of the Invention

The present invention relates to a field of semiconductor integrated circuit (IC) manufacturing, and more specifically, to a device having and a method of forming a hybrid high-k gate dielectric film.

2. Discussion of Related Art

An integrated circuit (IC) may include various active devices and passive devices. In particular, the IC may be designed using a complementary metal-oxide-semiconductor (CMOS) technology that includes an NMOS transistor and a PMOS transistor. Other devices, such as resistors, capacitors, and inductors, may also be included.

A scaling down of dimensions of the integrated circuit (IC) depends on a combination of technical and economic factors. For over 40 years, Moore's Law has accurately predicted a doubling in density of the IC every 18 months.

The transistors may be fabricated in a substrate on a wafer. The substrate may be formed from a semiconductor material, such as Silicon. The transistors have a gate dielectric film. The gate dielectric film may be formed from an oxidation of the Silicon. The oxidation may be performed thermally. The resultant gate oxide, such as $SiO_2$, has a dielectric constant, k, with a value of 3.9.

Scaling down each succeeding generation of the IC requires a reduction in channel length and gate dielectric film thickness. However, the problems of polysilicon gate depletion, high gate resistance, high gate (quantum-mechanical) tunneling leakage current, and Boron penetration into the channel region become more severe.

In particular, a need exists for a gate dielectric film that is formed from a material with a higher value of k than the $SiO_2$.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention describes a device having and a method of forming a hybrid high-k dielectric film between a channel region and a metal gate (electrode) of a transistor.

Figure 1:
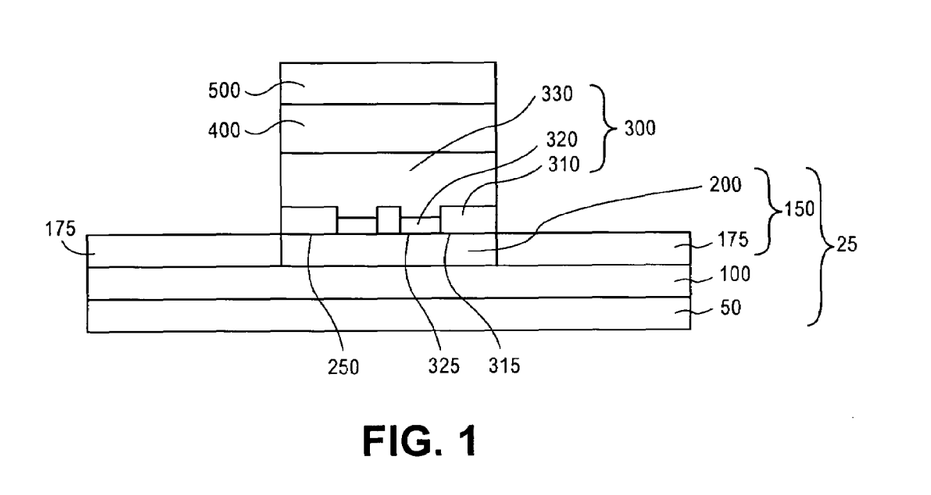
FIG. 1 shows a device having a hybrid high-k gate dielectric film according to an embodiment of the present invention.

As shown in an embodiment of the present invention in FIG. 1, a buried layer 100 may be formed on a wafer 50. The buried layer 100 may provide an electrical isolation for the transistor primarily in a vertical direction.

In an embodiment of the present invention, the buried layer 100 may include a heavily doped region, such as formed by ion implantation, that may be reversed-biased during operation of a transistor to provide electrical isolation.

In an embodiment of the present invention, the buried layer 100 may include an insulator, such as a buried oxide (BOX) layer of Silicon Oxide ($SiO_2$). In an embodiment of the present invention, the BOX layer may be formed by ion implantation of oxygen followed by annealing. In an embodiment of the present invention, the BOX layer may be formed by wafer bonding, polishing, and cleaving.

In an embodiment of the present invention, the BOX layer may have a thickness of 45-65 nm. In an embodiment of the present invention, the BOX layer may have a thickness of 30-45 nm. In an embodiment of the present invention, the BOX layer may have a thickness of 20-30 nm.

In an embodiment of the present invention, an ultra-thin body 150 may be formed over the buried layer 100. In an embodiment of the present invention, the ultra-thin body 150 may include an elemental semiconductor or a compound semiconductor.

In an embodiment of the present invention, the ultra-thin body 150 may have a thickness of 20-35 nm. In an embodiment of the present invention, the ultra-thin body 150 may have a thickness of 12-20 nm. In an embodiment of the present invention, the ultra-thin body 150 may have a thickness of 7-12 nm.

In an embodiment of the present invention, a semiconductor-on-insulator (SOI) substrate 25 may include the ultra-thin body 150 stacked over the buried layer 100 over the wafer 50. The SOI substrate may allow a transistor to operate at a higher switching speed or with a lower power consumption when compared to a bulk semiconductor substrate.

In an embodiment of the present invention, the wafer 50 may include shallow trench isolation (STI) that extends from a surface of the SOI substrate 25 towards the buried layer 100 below. The STI (not shown) may provide an electrical isolation around a periphery of the transistor primarily in a horizontal (or lateral) direction.

In an embodiment of the present invention when the ultra-thin body 150 is very thin and is formed from a material that is thermally oxidizable, the wafer 50 may include local oxidation of silicon (LOCOS) for lateral isolation instead of STI. The LOCOS may be modified, such as by including a recess or a polysilicon buffer layer (PBL), to reduce lateral encroachment of the ultra-thin body 150 by a bird's beak that accompanies thermal oxidation.

In an embodiment of the present invention, a hybrid high-k gate dielectric film may be formed on a non-SOI wafer (not shown) that includes a channel region 200 in a bulk semiconductor substrate 50 without an underlying buried layer 100.

A channel region 200 may be formed in the ultra-thin body 150 over a portion of the buried layer 100. In an embodiment of the present invention as shown in FIG. 1, the channel region 200 may be fully depleted during operation of the transistor, thus occupying an entire thickness of the ultra-thin body 150 above the buried layer 100. A fully-depleted transistor has an improved sub-threshold slope and better control of threshold voltage.

In an embodiment of the present invention, the channel region 200 may only be partially depleted during operation of the transistor, thus occupying an upper portion (not shown) of the ultra-thin body 150 above the buried layer 100.

In an embodiment of the present invention, all regions of the ultra-thin body 150, including the channel region 200 and the non-channel region 175 (that is located laterally outside the channel region 200), such as source and drain, may be formed from the same material.

In an embodiment of the present invention, the non-channel region 175 of the ultra-thin body 150 (that is located vertically below (not shown) the channel region 200 when partially depleted) may be formed from a different material than the channel region 200.

In an embodiment of the present invention, the non-channel region 175 of the ultra-thin body 150 (that is located laterally outside the channel region 200) may be formed from a different material than the channel region 200.

In an embodiment of the present invention, the channel region 200 may include a compound semiconductor.

In an embodiment of the present invention, the channel region 200 may include a binary compound semiconductor.

In an embodiment of the present invention, the channel region 200 may include two elements from Group IV A of the periodic table, such as Silicon-Germanium ($Si_xGe_{1-x}$) where $0<x<1$. In an embodiment of the present invention, the channel region 200 may include $Si_{0.7}Ge_{0.3}$.

In an embodiment of the present invention, the Silicon Germanium is thermally oxidizable at a surface 250 when heated to a temperature, such as 400-500 degrees Centigrade. Formation of a stable Oxide or other thermal insulating layer will terminate dangling bonds and passivate the surface 250.

In an embodiment of the present invention, the channel region 200 may include one element from Group III A and one element from Group V A of the periodic table, such as Aluminum Nitride (AlN), Aluminum Phosphide (AlP), Aluminum Arsenide (AlAs), Gallium Nitride (GaN), Gallium Phosphide (GaP), Gallium-Arsenide (GaAs), Gallium Antimonide (GaSb), Indium Nitride (InN), Indium-Phosphide (InP), Indium Arsenide (InAs), or Indium Antimonide (InSb).

In an embodiment of the present invention, the Gallium Arsenide (GaAs) is not thermally oxidizable at a surface 250 when heated to a temperature, such as 400-500 degrees Centigrade.

In an embodiment of the present invention, the channel region 200 may include one element from Group II B and one element from Group VI A of the periodic table, such as Zinc Selenide (ZnSe) or Cadmium Telluride (CdTe).

In an embodiment of the present invention, the channel region 200 may include one element from Group IV A and one element from Group VI A of the periodic table, such as Lead Telluride (PbTe).

In an embodiment of the present invention, the channel region 200 may include a ternary compound semiconductor.

In an embodiment of the present invention, the channel region 200 may include two elements from Group III A and one element from Group V A of the periodic table, including Aluminum Gallium Arsenide ($Al_xGa_{1-x}As$), Indium Aluminum Arsenide ($In_xAl_{1-x}As$), or Indium Gallium Arsenide ($In_xGa_{1-x}As$) where $0<x<1$. In an embodiment of the present invention, the channel region 200 may include $In_{0.15}Ga_{0.85}As$. In an embodiment of the present invention, the channel region 200 may include $In_{0.20}Ga_{0.80}As$. In an embodiment of the present invention, the channel region 200 may include $In_{0.53}Ga_{0.47}As$.

In an embodiment of the present invention, the channel region 200 may include a quaternary compound semiconductor.

In an embodiment of the present invention, the channel region 200 may include a compound semiconductor with a uniform alloy concentration as a function of depth below the surface 250 of the channel region 200. The alloy concentration may be kept constant to control a particular characteristic, parameter, or property.

In an embodiment of the present invention, the channel region 200 may include a compound semiconductor with a variable alloy concentration as a function of depth below the surface 250 of the channel region 200. The alloy concentration may be graded to tune a particular characteristic, parameter, or property.

In an embodiment of the present invention, the channel region 200 may include a first layer of a first compound semiconductor with a constant alloy concentration stacked over a second layer of a second compound semiconductor with a graded alloy concentration. The second compound semiconductor may include the same or different elements as the first semiconductor.

In an embodiment of the present invention, the channel region 200 may be crystalline. A crystallographic orientation may affect mobility of a charge carrier. The charge carrier may include an electron in an NMOS transistor or a hole in a PMOS transistor.

In an embodiment of the present invention, the channel region 200 may include a crystallographic orientation of (001). In an embodiment of the present invention, the channel region 200 may include a crystallographic orientation of (210). In another embodiment of the present invention, the channel region 200 may include a crystallographic orientation of (611).

In an embodiment of the present invention, a first surface portion 315 and a second surface portion 325 of the channel region 200 may include different crystallographic orientations.

In an embodiment of the present invention, the channel region 200 may include multiple crystallographic orientations.

In an embodiment of the present invention, the channel region 200 may include a compound semiconductor, such as an alloy of a Group III A material and a Group V A material, for an NMOS transistor and an elemental semiconductor of a Group IV A material, such as Germanium, for a PMOS transistor.

In an embodiment of the present invention, the channel region 200 may be located within a P-well for an NMOS transistor or within an N-well for a PMOS transistor.

In an embodiment of the present invention, the channel region 200 may be doped to be n-type or p-type.

In an embodiment of the present invention, the channel region 200 may be doped intrinsically, such as during formation of the channel region 200.

In an embodiment of the present invention, the channel region 200 may be doped extrinsically, such as after formation of the channel region 200. After formation, the doping may occur in a solid phase with ion implantation. Alternatively, the doping may occur in a liquid phase with localized melting, such as by a laser, followed by recrystallization. The rates of heating and cooling may be separately optimized to adjust extent and orientation of recrystallization as a function of depth below the surface 250 of the channel region 200.

In an embodiment of the present invention, a low-energy ion implantation into the channel region 200 may be used to adjust a threshold voltage, $V_t$, of the transistor.

In an embodiment of the present invention, the surface 250 may be treated before adjusting the threshold voltage of the transistor. In another embodiment of the present invention, the surface 250 may be treated after adjusting the threshold voltage of the transistor.

In an embodiment of the present invention, the surface 250 may be treated without adjusting the threshold voltage of the transistor either before or after the treatment.

In an embodiment of the present invention, the surface 250 may be treated with a chemical compound containing an element from Group VI A, such as Sulfur or Selenium. The chemical compound may be in liquid or gaseous form.

In an embodiment of the present invention, the surface 250 may be treated with a plasma.

In an embodiment of the present invention, the surface 250 may be treated to increase a surface area.

In an embodiment of the present invention, the surface 250 may be treated with Hydrogen. In an embodiment of the present invention, Hydrogen passivates shallow donor and acceptor impurities in the substrate. In an embodiment of the present invention, Hydrogen alters an interfacial layer and changes a pinning position of the Fermi level at the surface 250.

In an embodiment of the present invention, the surface 250 may be treated to reduce a concentration of Carbon to an extremely low concentration, such as less than or equal to 0.1 atomic percent.

In an embodiment of the present invention, the surface 250 may be treated to reduce a concentration of Nitrogen to an extremely low concentration, such as less than or equal to 0.1 atomic percent.

In an embodiment of the present invention, the surface 250 may be treated to retard diffusion of atoms in the channel region 200.

In an embodiment of the present invention, the surface 250 may be treated to retard propagation of defects in the channel region 200.

In an embodiment of the present invention, the surface 250 may be treated to prevent formation of an interfacial layer in the channel region 200.

In an embodiment of the present invention, the surface 250 may be treated to enhance mobility of carriers in the channel region 200.

In an embodiment of the present invention, the surface 250 is roughened, such as to include a depth of 2.0-5.0 nm. According to an embodiment of the present invention, changing a smoothness of the surface 250 of the channel region 200 may affect homogeneity of an electric field that may be applied after a hybrid high-k gate dielectric film 300 and a gate (electrode) 500 have been formed.

In an embodiment of the present invention, the surface 250 is amorphized, such as to include a peak-to-valley range of 4.0-10.0 nm. The surface 250 of the channel region may be amorphized, such as by ion implantation of an elemental constituent of the material that forms the channel region 200.

In an embodiment of the present invention, the crystal lattice in the channel region 200 is not strained.

In an embodiment of the present invention, the crystal lattice in the channel region 200 is strained, such as to a depth of 6.0-15.0 nm. Straining the lattice may increase carrier mobility although the effect on electrons and holes may not be the same.

The strain may exist globally (across the wafer 50) or locally. The strain may result from an internally mismatched lattice or an externally applied layer. The strain may be elastic. The strain may be compressive or tensile. The strain may be uniaxial or biaxial. In an embodiment of the present invention, the crystal lattice may include a biaxial tensile strain, such as to increase electron mobility.

In an embodiment of the present invention, the strained lattice may be located over a buffer layer, such as a relaxed lattice, which is, in turn, located over the buried layer 100. In an embodiment of the present invention, the strained lattice may be located directly over the buried layer 100 without an intervening buffer layer, such as a relaxed lattice.

Next, a hybrid high-k gate dielectric film 300 is formed over the channel region 200 according to an embodiment of the present invention.

In an embodiment of the present invention, the term hybrid may refer to a difference in an attribute or parametric property of the film, such as film continuity, film thickness, film composition, film orientation, film doping concentration, film dielectric constant, film crystallinity, film amorphization, film roughness, film surface area, film volume, or film density.

In an embodiment of the present invention, the term high-k may refer to a dielectric constant that is greater than the dielectric constant of Silicon Oxide which has a value of about 3.9.

In an embodiment of the present invention, the hybrid high-k gate dielectric film 300 may include a combination of layers. In an embodiment of the present invention, the layers may be stacked in a multilayer 300 that is heterogeneous. In an embodiment of the present invention, the layers may be stacked in a multilayer 300 that is homogeneous. In an embodiment of the present invention, the term multilayer 300 may refer to a structure that includes two or more layers that may be different in at least one attribute or parametric property.

In an embodiment of the present invention, the hybrid high-k gate dielectric film 300 may include a laminated structure. In an embodiment of the present invention, the odd-layer film may differ from the even-layer film in continuity, thickness, composition, orientation, doping concentration, dielectric constant, crystallinity, amorphization, roughness, surface area, volume, or density.

In an embodiment of the present invention, the hybrid high-k gate dielectric film 300 may include a composite structure. In an embodiment of the present invention, a first dielectric material may be distributed within a matrix of a second dielectric material.

In an embodiment of the present invention, at least one layer in the multilayer 300 is discontinuous.

In an embodiment of the present invention, at least one layer in the multilayer 300 has a sub-monolayer thickness.

In an embodiment of the present invention, all of the layers in the multilayer 300 are discontinuous.

In an embodiment of the present invention, all of the layers in the multilayer 300 have a sub-monolayer thickness.

In an embodiment of the present invention, the hybrid high-k gate dielectric film 300 includes a multilayer film 300 that varies in structure vertically and laterally. In an embodiment of the present invention, the hybrid high-k gate dielectric film 300 includes two or more layers that are located in close proximity vertically or horizontally. In an embodiment of the present invention, the hybrid high-k gate dielectric film 300 includes two or more layers with some portions that are arranged to be vertically overlying, laterally adjacent, laterally contiguous, laterally overlapping, or wrapped around each other.

In an embodiment of the present invention, the hybrid high-k gate dielectric film 300 includes a multilayer film that varies in function vertically and laterally.

In an embodiment of the present invention, the hybrid high-k gate dielectric film 300 may include a multilayer film 300 that varies in operation of the transistor vertically and laterally.

In an embodiment of the present invention, the hybrid high-k gate dielectric film 300 is physically invariant relative to the compound semiconductor in the underlying channel region 200.

In an embodiment of the present invention, the hybrid high-k gate dielectric film 300 is chemically compatible with the compound semiconductor in the underlying channel region 200.

In an embodiment of the present invention, the hybrid high-k gate dielectric film 300 is thermodynamically stable with respect to the compound semiconductor in the underlying channel region 200.

In an embodiment of the present invention, the hybrid high-k gate dielectric film 300 reduces an interface state density, $D_{it}$, <1 E11 eV$^{-1}$ cm$^{-2}$. In an embodiment of the present invention, the hybrid high-k gate dielectric film 300 reduces oxide trap density. In an embodiment of the present invention, the hybrid high-k gate dielectric film 300 reduces a leakage current density to <1 E-10 Amp/cm$^2$ at zero bias. In an embodiment of the present invention, the hybrid high-k gate dielectric film 300 increases a breakdown voltage to >3.5 E6 Volts/cm. In an embodiment of the present invention, the hybrid high-k gate dielectric film 300 increases a breakdown voltage to >5.0 E6 Volts/cm.

In another embodiment of the present invention, the hybrid high-k gate dielectric film 300 unpins a Fermi level at, or near, a surface 250 of the channel region 200. In still another embodiment of the present invention, the hybrid high-k gate dielectric film 300 drives a Fermi level at, or near, an interface 250 with the channel region 200 to a new position. In yet another embodiment of the present invention, the hybrid high-k gate dielectric film 300 alters, such as reduces, a bending of an energy band at, or near, a surface 250 of the channel region 200.

In an embodiment of the present invention, the hybrid high-k gate dielectric film 300 may include a combination of materials. In an embodiment of the present invention, the hybrid high-k gate dielectric film 300 may include a first dielectric material 310, a second dielectric material 320, and a third dielectric material 330.

In an embodiment of the present invention, the dielectric materials may be electrically insulating and thermally conducting.

In an embodiment of the present invention, the first dielectric material 310 is discontinuous and formed over a first surface portion 315 of the channel region 200 in the ultra-thin body. The first surface portion 315 of the channel region 200 may correspond to a multitude of discrete and non-contiguous locations where an underlying structure, such as a crystalline structure, may be physically or thermodynamically perturbed by an elemental constituent of a dopant or a material in the channel region 200.

In an embodiment of the present invention, the first dielectric material 310 may unpin the Fermi level at, or near, the surface 250 of the compound semiconductor in the first surface portion 315 of the channel region 200.

In an embodiment of the present invention, the first dielectric material 310 does not react, or chemically bond, with the channel region 200. In an embodiment of the present invention, the first dielectric material 310 does not wet the surface 250 of the channel region 200.

In an embodiment of the present invention, the first dielectric material 310 is formed with Atomic Layer Deposition (ALD). In an embodiment of the present invention, the ALD process may be performed at a temperature of 100-200 degrees Centigrade. In an embodiment of the present invention, the ALD process may be performed at a substrate temperature of 200-350 degrees Centigrade. In another embodiment of the present invention, the ALD process may be performed at a substrate temperature of 350-550 degrees Centigrade.

In an embodiment of the present invention, the ALD may be performed at a surface of a growing film of the first material 310 by alternating a pulse of a first gas-phase reactant with a pulse of a second gas-phase reactant. The alternating pulses of the first gas-phase reactant and the second gas-phase reactant are separated by purges with an inert gas.

The first gas-phase reactant may include a metal precursor. In an embodiment of the present invention, the metal precursor may include metal halide. In an embodiment of the present invention, the metal precursor may include silanol (SiOH). In an embodiment of the present invention, the metal precursor may include an alkoxide, such as tert-butoxide or ethoxide. In an embodiment of the present invention, the metal precursor may include an amide, such as alkyl amide or metal amide.

The second gas-phase reactant may include an oxygen source or oxidizer. The oxidizer may include water ($H_2O$), hydrogen peroxide ($H_2O_2$), oxygen ($O_2$), ozone ($O_3$), or oxygen plasma.

The precursors must be sufficiently volatile and reactive, but must not self-decompose at the deposition temperature or etch the surface 250 of the channel region 200.

By alternating each of the two (or more) self-limiting reactions of gas-phase reactants with surface-attached species while the gas-phase reactants are chemisorbed to the surface 250 of the channel region 200, the film thickness and composition of the first dielectric material 310 formed over the surface 250 of the channel region 200 may be controlled very precisely over the multitude of discrete and non-contiguous locations spread over a large surface area. Provided that all available surface sites are occupied (saturated) by adsorbed precursor molecules, the choice of precursor pulse length (reactant flux or dose uniformity), such as 1-2 seconds, may not significantly affect the growth rate of the first dielectric material 310.

More specifically, the film thickness of the first dielectric material 310 formed by ALD increases, usually linearly but may be non-linearly, as a function of the number of cycles. In an ideal case, a monolayer may be formed across an entire surface of the channel region 200 by every reaction cycle. However, in practice, steric hindrance may limit each reaction cycle to a fraction of a monolayer.

In an embodiment of the present invention, a growth rate for ALD may include 0.01-0.06 nm/cycle. In an embodiment of the present invention, a growth rate for ALD may include 0.06-0.24 nm/cycle. In an embodiment of the present invention, a growth rate for ALD may include 0.24-0.48 nm/cycle.

In an embodiment of the present invention, formation of the first dielectric material 310 with a desired film thickness and composition may include 5-20 cycles of the ALD process. In an embodiment of the present invention, formation of the first dielectric material 310 with the desired film thickness and composition may include 20-70 cycles of the ALD process. In an embodiment of the present invention, formation of the first dielectric material 310 with the desired thickness and composition may include 70-210 cycles of the ALD process.

In an embodiment of the present invention, the first dielectric material 310 is a discontinuous film that covers the first surface portion 315, or 0.35-0.50 of the area of the surface 250, of the channel region 200. In an embodiment of the present invention, the first dielectric material 310 is a discontinuous film that covers a first surface portion 315, or 0.50-0.70 of the area of the surface 250, of the channel region 200. In an embodiment of the present invention, the first dielectric material 310 is a discontinuous film that covers a first surface portion 315, or 0.70-0.95 of the area of the surface 250, of the channel region 200.

In an embodiment of the present invention, the discontinuous film of the first dielectric material 310 has a thickness of 0.1-0.5 nanometers over the surface 250 of the channel region 200. In an embodiment of the present invention, the discontinuous film of the first dielectric material 310 has a thickness of 0.5-2.0 nanometers over the surface 250 of the channel region 200. In an embodiment of the present invention, the discontinuous film of the first dielectric material 310 has a thickness of 2.0-6.0 nanometers over the surface 250 of the channel region 200.

In an embodiment of the present invention, the first dielectric material 310 forms over the surface 250 of the channel region 200 by one-dimensional growth or island growth. The islands that are formed initially may be extremely small and discontinuous due to strong clustering. As the islands proliferate, the edges of the islands may meet. Then, the islands may merge to form ever larger islands. As the islands grow, the ratio of surface area to volume in a film of the first dielectric material 310 may decrease.

A monolayer may have a nominal thickness of 0.3-0.4 nm. In an embodiment of the present invention, the first dielectric material 310 may become a continuous film that completely covers, or saturates, the first surface portion 315 of the channel region 200 in its entirety only when it achieves a thickness that is equivalent to 1.5-2.5 monolayers.

A density of atoms in a crystalline structure may depend on a lattice constant. In an embodiment of the present invention, one-and-a-half monolayers may be equivalent to a density of about (0.6-2.0) E15 atoms/cm$^3$.

In an embodiment of the present invention, the first dielectric material 310 may become a continuous film that completely covers, or saturates, the first surface portion 315 of the channel region 200 in its entirety only when it achieves a thickness that is equivalent to 2.5-4.0 monolayers.

In an embodiment of the present invention, the first dielectric material 310 may become a continuous film that completely covers, or saturates, the first surface portion 315 of the channel region 200 in its entirety only when it achieves a thickness that is equivalent to 4.0-6.0 monolayers.

In an embodiment of the present invention, the continuous film of the first dielectric material 310 has a thickness of 0.1-0.6 nanometer over the surface 250 of the channel region 200. In an embodiment of the present invention, the continuous film of the first dielectric material 310 has a thickness of 0.6-2.4 nanometers over the surface 250 of the channel region 200. In an embodiment of the present invention, the continuous film of the first dielectric material 310 has a thickness of 2.4-4.8 nanometers over the surface 250 of the channel region 200.

The first dielectric material 310 may include various dielectric materials, either individually or in combination. The dielectric materials may have properties that are suitable for the channel region 200 of the transistor.

In an embodiment of the present invention, the first dielectric material 310 may include a ceramic compound. In an embodiment of the present invention, the ceramic compound in the first dielectric material 310 may include an inorganic or non-metallic element, such as Boride (III A), Carbide (IV A), Nitride (V A), Oxide (VI A), Silicide (IV A), or Sulfide (VI A). In an embodiment of the present invention, the ceramic compound in the first dielectric material 310 may include Oxynitride or Silicate.

In an embodiment of the present invention, the ceramic compound in the first dielectric material 310 may include a metallic element, such as Tantalum (V B), Hafnium (IV B), Zirconium (IV B), Titanium (IV B), Gadolinium (III B), Lanthanum (III B), Scandium (III B), Yttrium (III B), Gallium (III A), and Aluminum (III A).

In an embodiment of the present invention, the ceramic compound in the first dielectric material 310 may be doped, such as with a metallic element.

In an embodiment of the present invention, the band gap may be tuned by alloying a metal with the ceramic compound in the first dielectric material 310.

In an embodiment of the present invention, the first dielectric material 310 may include an intermetallic compound, such as Beryllide (II A), Aluminide (III A), Phosphide (V A), Arsenide (V A), or Antimonide (V A). The intermetallic compound has different properties from its metallic constituents.

In an embodiment of the present invention, the first dielectric material 310 may be amorphous.

In another embodiment of the present invention, the first dielectric material 310 may be crystalline.

In an embodiment of the present invention, the first dielectric material 310 may be polycrystalline with a plurality of grains separated by boundaries or interfaces. The grains may be extremely small and uniform. In an embodiment of the present invention, the grain size may be 0.1-0.3 nm. In an embodiment of the present invention, the grain size may be 0.3-0.7 nm. In an embodiment of the present invention, the grain size may be 0.7-1.4 nm.

In an embodiment of the present invention, the dielectric material may increase in crystallinity, such as from 10% to 60% of total volume, when the deposition temperature is increased, such as from 100 to 150 degrees Centigrade.

In an embodiment of the present invention, the dielectric material may increase in surface roughness, such as from 1% to 5% of total film thickness, when the deposition temperature is increased from 150 to 200 degrees Centigrade. In some cases, surface roughness of the dielectric material may be limited by underlying substrate roughness.

The amorphous form of the material usually has a smoother surface, a lower leakage current, and a higher breakdown voltage than the polycrystalline form. The polycrystalline form of the material usually has a higher density and a higher dielectric constant than the amorphous form.

In an embodiment of the present invention when the first dielectric material 310 is discontinuous, the second dielectric material 320 may be formed over a second surface portion 325 of the channel region 200. The first dielectric material 310 covers the first surface portion 315 of the channel region 200, but does not cover the second surface portion 325 of the channel region 200.

The second surface portion 325 of the channel region 200 may correspond to a multitude of discrete and non-contiguous locations where an underlying structure, such as a crystalline structure, may be physically or thermodynamically perturbed by an elemental constituent of a dopant or a material in the channel region 200.

In an embodiment of the present invention, the channel region 200 is partitioned into multiple segments having different sizes, some of which belong to a first surface portion 315 while others belong to a second surface portion 325. The segments may correspond to the islands formed by ALD at different stages of growth. The partitioning may be accomplished by photolithography and etch.

In an embodiment of the present invention, the second material 320 may be formed adjacent to the first material 310. In an embodiment of the present invention, the second material 320 may be formed contiguous to the first material 310. The second material 320 may be chemically compatible with the first material 310. The second material 320 may be physically compatible with the first material 310.

In an embodiment of the present invention, the second dielectric material 320 may unpin the Fermi level at, or near, a surface 250 of the compound semiconductor in the second surface portion of the channel region 200.

In an embodiment of the present invention, the second dielectric material 320 does not react with the surface 250 of the channel region 200. In an embodiment of the present invention, the second dielectric material 320 does not wet the surface 250 of the channel region 200.

In an embodiment of the present invention, the second dielectric material 320 is a discontinuous film that covers 0.05-0.30 of the area of the surface 250 of the channel region 200. In an embodiment of the present invention, the second dielectric material 320 is a discontinuous film that covers 0.30-0.50 of the area of the surface 250 of the channel region 200. In an embodiment of the present invention, the second dielectric material 320 is a discontinuous film that covers 0.50-0.65 of the area of the surface 250 of the channel region 200.

In an embodiment of the present invention, the discontinuous film of the second dielectric material 320 has a thickness of 0.2-0.5 nanometers over the surface 250 of the channel region 200. In an embodiment of the present invention, the discontinuous film of the second dielectric material 320 has a thickness of 0.5-1.2 nanometers over the surface 250 of the channel region 200. In an embodiment of the present invention, the discontinuous film of the second dielectric material 320 has a thickness of 1.2-3.0 nanometers over the surface 250 of the channel region 200.

As shown in an embodiment of the present invention in FIG. 1, the second dielectric material 320 may be thinner than the first dielectric material 310.

Figure 2:
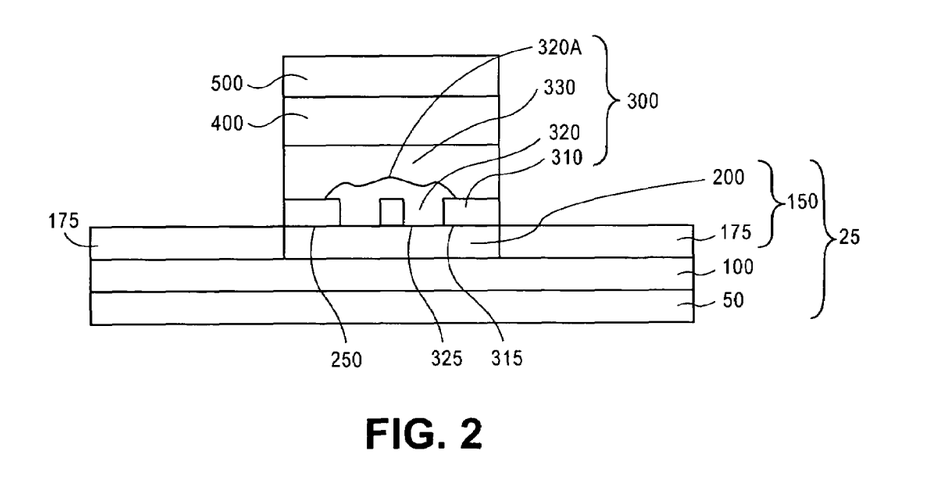
FIG. 2 shows a device having a hybrid high-k gate dielectric film, wherein the second dielectric material is thicker than the first dielectric material.

As shown in another embodiment of the present invention in FIG. 2, the second dielectric material 320 may be thicker than the first dielectric material 310. In an embodiment of the present invention, if a strip of the first dielectric material 310 is narrow enough, the second dielectric material 320 may merge together 320A over the top of the narrow strip of the first dielectric material 310.

The first dielectric material 310, when discontinuous, covers the first surface portion 315 of the channel region 200, while the second dielectric material 320, when discontinuous, covers the second surface portion 325 of the channel region 200.

In an embodiment of the present invention, the band gap may be tuned by adjusting a (surface-area) ratio of the surface area of the first dielectric material 310 relative to the surface area of the second dielectric material 320 in proximity or contact with the surface 250 of the channel region 200.

In an embodiment of the present invention, the surface-area ratio of the first surface portion 315 (of the first dielectric material 310) to the second surface portion 325 (of the second dielectric material 320) may be selected from a range of 0.4-2.0. In an embodiment of the present invention, the surface-area ratio of the first surface portion 315 (of the first dielectric material 310) to the second surface portion 325 (of the second dielectric material 320) may be selected from a range of 2.0-8.0. In an embodiment of the present invention, the surface-area ratio of the first surface portion 315 (of the first dielectric material 310) to the second surface portion 325 (of the second dielectric material 320) may be selected from a range of 8.0-24.0.

In an embodiment of the present invention, the underlying second dielectric material 320 may be formed adjacent to the underlying first dielectric material 310. In an embodiment of the present invention, the underlying second dielectric material 320, when thick enough, may completely surround, cover, or encapsulate, 320A a narrow strip of the first dielectric material 310.

In an embodiment of the present invention, the band gap may be tuned by adjusting a (thickness) ratio of the thickness of the first dielectric material 310 and the thickness of the second dielectric material 320 in proximity or contact with the surface 250 of the channel region 200.

In an embodiment of the present invention, the band gap may be tuned by adjusting a (volume) ratio of the volume of the first dielectric material 310 and the volume of the second dielectric material 320 in proximity or contact with the surface 250 of the channel region 200.

In an embodiment of the present invention, the band gap may be tuned by adjusting a positioning or placement (in 3-dimensions) of the first dielectric material 310 and the second dielectric material 320 relative to the surface 250 of the channel region 200.

In an embodiment of the present invention, the ALD process may be used to form the second dielectric material 320 over the second surface portion 325 of the channel region 200. The ALD process may produce (a) a dense and pinhole-free film with (b) good thickness uniformity over a large surface area and with (c) excellent conformality (step coverage) over underlying topography.

The second dielectric material 320 may include various dielectric materials, either individually or in combination. The dielectric materials may have properties that are suitable for the channel region 200 of the transistor.

In an embodiment of the present invention, the second dielectric material 320 may include a ceramic compound. In an embodiment of the present invention, the ceramic compound in the second dielectric material 320 may include an inorganic or non-metallic element, such as Boride (III A), Carbide (IV A), Nitride (V A), Oxide (VI A), Silicide (IV A), or Sulfide (VI A). In an embodiment of the present invention, the ceramic compound in the second dielectric material 320 may include Oxynitride or Silicate.

In an embodiment of the present invention, the ceramic compound in the second dielectric material 320 may be doped, such as with a metallic element. In an embodiment of the present invention, the band gap may be tuned by alloying a metal with the ceramic compound in the second dielectric material 320.

In an embodiment of the present invention, the ceramic in the second dielectric material 320 may be a compound that includes a metallic element, such as Tantalum (V B), Hafnium (IV B), Zirconium (IV B), Titanium (IV B), Gadolinium (III B), Lanthanum (III B), Scandium (III B), Yttrium (III B), Gallium (III A), and Aluminum (III A).

In an embodiment of the present invention, the second dielectric material 320 may be amorphous.

In an embodiment of the present invention, the second dielectric material 320 may be crystalline.

In an embodiment of the present invention, the second dielectric material 320 may be polycrystalline with a plurality of grains separated by boundaries or interfaces. The grains may be extremely small and uniform. In an embodiment of the present invention, the grain size may be 0.1-0.3 nm. In an embodiment of the present invention, the grain size may be 0.3-0.7 nm. In an embodiment of the present invention, the grain size may be 0.7-1.4 nm.

In an embodiment of the present invention, a dehydration bake is performed to remove any moisture or water that may be physisorbed to the surface of the first dielectric material 310 or the second dielectric material 320. In an embodiment of the present invention, the bake is performed in a vacuum environment of 2 E-10 Torr at a temperature of 200-330 degrees Centigrade for 15-60 minutes.

In an embodiment of the present invention, a desorption bake is performed to remove any air or oxygen that may be chemisorbed to the surface of the first dielectric material 310 or the second dielectric material 320. In an embodiment of the present invention, the bake is performed in a chemically reducing environment, such as with hydrogen ($H_2$) or forming gas ($N_2$, $H_2$), at a temperature of 550-700 degrees Centigrade.

In an embodiment of the present invention, a rapid thermal anneal is performed to remove damage or defect that may be located at an interface between the first dielectric material 310 and the second dielectric material 320. In an embodiment of the present invention, the bake is performed with rapid thermal processing in a chemically inert environment at a temperature of 825-1,075 degrees Centigrade for 30 seconds. Alternatively, a flash anneal may be used.

The first dielectric material 310, the second dielectric material 320, or the third dielectric material 330 may include various dielectric materials, either individually or in combination. The dielectric materials may have properties that are suitable for the channel region 200 of the transistor.

In an embodiment of the present invention, the dielectric materials may include a ceramic compound. In an embodiment of the present invention, the ceramic compound may include an inorganic or non-metallic element, such as Boride (III A), Carbide (IV A), Nitride (V A), Oxide (VI A), Silicide (IV A), or Sulfide (VI A). In an embodiment of the present invention, the first dielectric material 310 may include Oxynitride or Silicate.

In an embodiment of the present invention, the ceramic compound may include a metallic element, such as Tantalum (V B), Hafnium (IV B), Zirconium (IV B), Titanium (IV B), Gadolinium (III B), Lanthanum (III B), Scandium (III B), Yttrium (III B), Gallium (III A), and Aluminum (III A).

In an embodiment of the present invention, the ceramic compound may be doped, such as with a metallic element. In an embodiment of the present invention, the band gap may be tuned by alloying a metal with the dielectric materials.

In an embodiment of the present invention, the dielectric materials may include an intermetallic compound, such as Beryllide (II A), Aluminide (III A), Phosphide (V A), Arsenide (V A), or Antimonide (V A). The intermetallic compound has different properties from its metallic constituents.

In an embodiment of the present invention, the dielectric materials may be amorphous.

In another embodiment of the present invention, the dielectric materials may be crystalline.

In an embodiment of the present invention, the dielectric materials may be polycrystalline with a plurality of grains separated by boundaries or interfaces. The grains may be extremely small and uniform. In an embodiment of the present invention, the grain size may include 0.1-0.3 nm. In an embodiment of the present invention, the grain size may include 0.3-0.7 nm. In an embodiment of the present invention, the grain size may include 0.7-1.4 nm.

The properties of the dielectric materials for the first dielectric material 310, the second dielectric material 320, or the third dielectric material 330 may vary depending upon the method of preparation or processing of the dielectric materials during formation. In another embodiment of the present invention, the properties of the dielectric materials may vary depending upon the method of treatment or processing of the dielectric materials after formation.

In an embodiment of the present invention, the concentrations of the constituents of the first dielectric material 310, the second dielectric material 320, or the third dielectric material 330 may be adjusted to tune a particular characteristic, parameter, or property.

In an embodiment of the present invention, a third dielectric material 330 is formed over the first dielectric material 310 and the second dielectric material 320.

In an embodiment of the present invention, the third dielectric material 330 forms by two-dimensional growth or sheet growth.

In an embodiment of the present invention, a Gas Source Molecular Beam Epitaxy (GSMBE) process is used to form the third dielectric material 330.

In an embodiment of the present invention, a low-pressure Metal Organic Chemical Vapor Deposition (MOCVD) process is used to form the third dielectric material 330.

In an embodiment of the present invention, an Atomic Layer Deposition (ALD) process is used to form the third dielectric material 330. The precise but slow ALD process may become disadvantageous when forming a film with a thickness of over about 100 nm.

In an embodiment of the present invention, the first dielectric material 310, the second dielectric material 320, and the third dielectric material 330 are all formed with Atomic Layer Deposition.

In an embodiment of the present invention, the first dielectric material 310, the second dielectric material 320, and the third dielectric material 330 are all formed with ALD in the same tool by sequentially changing and purging the precursors.

In an embodiment of the present invention, the underlying second dielectric material 320 and the underlying first dielectric material 310 do not react with each other. In an embodiment of the present invention, the third dielectric material 330 reacts with the first dielectric material 310, but not with the second dielectric material 320. In an embodiment of the present invention, the third dielectric material 330 reacts with the second dielectric material 320, but not with the first dielectric material 310. In an embodiment of the present invention, the third dielectric material 330 reacts with both the first dielectric material 310 and the second dielectric material 320.

In an embodiment of the present invention, the material in the channel region 200 does not react with either the first dielectric material 310 or the second dielectric material 320, The third dielectric material 330 is used primarily for scaling of an Equivalent (Silicon) Oxide Thickness (EOT). The thickness of the first dielectric material 310 and the thickness of the second dielectric material 320 should be combined with the thickness of the third dielectric material 330 to determine the overall EOT of the hybrid high-k gate dielectric film.

In an embodiment of the present invention, the third dielectric material 330 has a thickness of 0.6-1.5 nm. In another embodiment of the present invention, the third dielectric material 330 has a thickness of 1.5-4.5 nm. In still another embodiment of the present invention, the third dielectric material 330 has a thickness of 4.5-16.0 nm.

In an embodiment of the present invention, a concentration of a constituent of the first dielectric material 310, the second dielectric material 320, or the third dielectric material 330 may vary as a function of depth (such as in a concentration gradient) from a surface 250 of the channel region 200.

In an embodiment of the present invention, the first dielectric material 310 and the second dielectric material 320 are not formed from a high-k material, but the third dielectric material 330 is formed from a high-k material.

In an embodiment of the present invention, the first dielectric material 310 may include a dielectric constant, k, of 3-9. In another embodiment of the present invention, the first dielectric material 310 may include a dielectric constant, k, of 9-21. In still another embodiment of the present invention, the first dielectric material 310 may include a dielectric constant, k, of 21-40. In yet another embodiment of the present invention, the first dielectric material 310 may include a dielectric constant, k, of 40-65.

In an embodiment of the present invention, the second dielectric material 320 may include a dielectric constant, k, of 3-6. In another embodiment of the present invention, the second dielectric material 320 may include a dielectric constant, k, of 6-10. In still another embodiment of the present invention, the second dielectric material 320 may include a dielectric constant, k, of 10-15.

In an embodiment of the present invention, the third dielectric material 330 may include a dielectric constant, k, of 10-15. In another embodiment of the present invention, the third dielectric material 330 may include a dielectric constant, k, of 15-25. In still another embodiment of the present invention, the third dielectric material 330 may include a dielectric constant, k, of 25-40. In yet another embodiment of the present invention, the third dielectric material 330 may include a dielectric constant, k, of 40-65.

In an embodiment of the present invention, the third dielectric material 330 may include various dielectric materials, either individually or in combination. The dielectric materials may have properties that are suitable for the channel region 200 of the transistor.

In an embodiment of the present invention, the third dielectric material 330 may include a binary material such as Alumina ($Al_2O_3$). Alumina may have an amorphous structure with a dielectric constant of 8.6 and a bandgap of 9.0 eV.

In an embodiment of the present invention, the third dielectric material 330 may include a binary material such as Scandium Oxide ($Al_2O_3$), Titanium Oxide ($TiO_2$), Yttrium Oxide ($Y_2O_3$), Zirconia ($ZrO_2$), Lanthanum Oxide ($La_2O_3$), Hafnium Oxide ($HfO_2$), or Tantalum Pentoxide ($Ta_2O_5$). Typical values for the dielectric constant include greater than 10.0 for Scandium Oxide, 60.0 for Titanium Oxide, 26.0 for Zirconia, 17.2 for Hafnium Oxide, and 25.0 for Tantalum Pentoxide.

In an embodiment of the present invention, the third dielectric material 330 may include a ternary material such as Lanthanum Aluminate ($LaAlO_3$), Hafnium Oxynitride (HfON), Zirconium Silicate ($ZrSiO_4$), Hafnium Silicate ($HfSiO_4$), Strontium Titanate ($SrTiO_3$), or Barium Titanate ($BaTiO_3$). Typical values for the dielectric constant include 7-12 for a crystalline form of Hafnium Silicate.

In an embodiment of the present invention, the third dielectric material 330 may include a quaternary material such as Hafnium Aluminum Oxynitride (HfAlON), Hafnium Silicate Oxynitride (HfSiON), Barium Strontium Titanate or BST ($BaSrTiO_3$), or Lead Scandium Tantalum Oxide ($PbScTaO_3$). Typical values for the dielectric constant include 300 for BST.

In an embodiment of the present invention, a buffer layer 400 may be formed over the third dielectric material 330. Next, a gate (electrode) 500 may be formed over the buffer layer 400. The buffer layer 400 may avoid inter-diffusion, prevent oxidation, or improve adhesion between the underlying hybrid high-k gate dielectric film 300 and the overlying gate (electrode) 500.

In an embodiment of the present invention, the gate (electrode) 500 may have one (planar) surface (such as a top surface) to control the channel region 200.

In another embodiment of the present invention, the gate (electrode) 500 may have two surfaces (such as a top surface and a bottom surface) to control the channel region 200.

In another embodiment of the present invention, the gate (electrode) 500 may have three surfaces (such as a top surface, a front surface, and a back surface) to control the channel region 200.

In another embodiment of the present invention, the gate (electrode) 500 may have four surfaces (such as a top surface, a front surface, a back surface, and a bottom surface) to control the channel region 200.

Surrounding the channel region 200 on two or more sides, such as in a finFET, helps to make the electric field more uniform throughout the channel region 200.

In an embodiment of the present invention, the transistor may include multiple gate electrodes, such as in a mugFET, to obtain better electrostatic integrity so as to suppress Short-Channel Effects (SCE) and increase current drive capability.

For simplicity of exposition, the following description will be based on an embodiment based on CMOS technology in which the transistor includes a planar gate (electrode).

In an embodiment of the present invention, the gate (electrode) may have a thickness of 15-25 nm. In an embodiment of the present invention, the gate (electrode) may have a thickness of 25-40 nm. In an embodiment of the present invention, the gate (electrode) may have a thickness of 40-65 nm.

When the channel region 200 includes Silicon, the work function of a gate (electrode) may be near the Conduction Band-edge Minimum (CBM) of Silicon for the NMOS transistor. In an embodiment of the present invention, the work function for the NMOS gate (electrode) may include 3.9-4.2 eV. In an embodiment of the present invention, the work function for the NMOS gate (electrode) may be about 4.05 eV for a planar gate (electrode). In an embodiment of the present invention, a single metal, such as a reactive metal, may be used to form the NMOS gate (electrode). In an embodiment of the present invention, the gate may include a material such as Hafnium (Hf), Zirconium (Zr), Aluminum (Al), or Tantalum (Ta).

In an embodiment of the present invention, a metal alloy may be used to form the NMOS gate (electrode).

When the channel region 200 includes Silicon, the work function of the gate (electrode) may be near the Valence Band-edge Maximum (VBM) of Silicon for the PMOS transistor. In an embodiment of the present invention, the work function for the PMOS gate (electrode) may include 4.9-5.2 eV. In an embodiment of the present invention, the work function for the PMOS gate (electrode) may be about 5.17 eV for a planar gate (electrode). In an embodiment of the present invention, a single metal, such as Cobalt (Co), Nickel (Ni), or Palladium (Pd), may be used to form the PMOS gate (electrode).

In an embodiment of the present invention, an inert metal, such as a metal nitride, may be used to form the PMOS gate (electrode). In an embodiment of the present invention, the gate may include a material such as Titanium Nitride (TiN), Tantalum Nitride (TaN), or Tungsten Nitride (WN) for the PMOS transistor. Other materials that may be used to form the PMOS gate (electrode) may include Molybdenum Nitride ($Mo_2N$) or Hafnium Nitride (HfN).

Other materials that may be used to form a gate (electrode) with a particular work function may include a metal-silicon-nitride, such as Titanium Silicon Nitride (TiSiN), Molybdenum Silicon Nitride (MoSiN), Hafnium Silicon Nitride (HfSiN), or Tantalum Silicon Nitride (TaSiN).

Other materials that may be used to form a gate (electrode) with a particular work function may include a metal-silicide, such as Molybdenum Silicide ($MoSi_x$), Hafnium Silicide ($HfSi_x$), or Tantalum Silicide ($TaSi_x$).

In an embodiment of the present invention, the work function for the NMOS gate (electrode) may be about 4.4 eV for a double gate (electrode). In an embodiment of the present invention, the gate (electrode) may include a material such as Titanium (Ti), Copper (Cu), or Tungsten (W).

In an embodiment of the present invention, the work function for the PMOS gate (electrode) may be about 4.8 eV for a double gate (electrode). In an embodiment of the present invention, the gate (electrode) may include a material such as Ruthenium (Ru), Molybdenum (Mo), or Cobalt (Co).

In an embodiment of the present invention, the channel region 200 may include $In_{0.2}Ga_{0.8}As$ with a semiconductor work function of 4.14 eV. In an embodiment of the present invention, a metal gate (electrode) formed of Titanium may have a metal work function of 3.95 eV.

A flatband voltage condition may be a difference between the semiconductor work function and the metal work function. However, surface states at the gate (electrode)/dielectric interface and at the dielectric/substrate interface may result in a Vt shift. In an embodiment of the present invention, the Vfb may depend on a thickness of the hybrid high-k gate dielectric film. In an embodiment of the present invention, the Vfb may depend on a composition of the hybrid high-k gate dielectric film.

Photolithography and etch may be used to form the gate (electrode). In an embodiment of the present invention, an alternating phase-shifting mask is used with deep ultraviolet (DUV) light to define the gate (electrode) in a chemically amplified photoresist. In another embodiment of the present invention, double patterning is used. The gate (electrode) may be trimmed as needed to reduce a linewidth (LW) or Critical Dimension (CD). A replacement gate (electrode) process flow may also be used.

The gate CD refers to a distance between two facing sides of the gate (electrode). The gate CD corresponds to a physical gate length, $L_g$, of 20-50 nm. This will result in a gate delay of (0.2-1.0) E-12 second for the NMOS transistor and (0.8-2.0) E-12 second for the PMOS transistor. The gate (electrode) may have a gate width, $W_g$.

The present invention may be included as part of various processes, devices, or technologies. In various embodiments of the present invention, the hybrid high-k gate dielectric film may be included in a process or device for a Metal Oxide Semiconductor Field Effect Transistor (MOSFET), Metal Semiconductor Field Effect Transistor (MESFET), Insulated Gate Heterostructure Field Effect Transistor (IG-HFET), or (Heterostructure) High Electron Mobility Transistor (HEMT).

During fabrication of the transistor, a raised (or elevated) source/drain may be formed adjacent to the two sides of the gate (electrode). First, a recess is etched in the regions adjacent to both sides of the gate (electrode) of the transistor using the gate (electrode) as an etch mask.

Next, the recessed regions adjacent to both sides of the gate (electrode) of the transistor may be filled. In an embodiment of the present invention, the recessed regions may be filled using Selective Epitaxial Growth (SEG).

In an embodiment of the present invention, the recessed regions for the NMOS transistor and the PMOS transistor may be filled with different materials. The materials in the recessed regions may be doped intrinsically, such as during deposition, or extrinsically, such as with ion implantation after deposition.

In an embodiment of the present invention, the recessed regions for the NMOS transistor may be filled with a binary compound semiconductor, such as Gallium Nitride, Gallium Arsenide, Indium Arsenide, or Indium Antimonide.

In an embodiment of the present invention, the recessed regions for the NMOS transistor may be filled with a ternary compound semiconductor, such as Aluminum Gallium Arsenide or Indium Gallium Arsenide.

In an embodiment of the present invention, the recessed regions for the PMOS transistor may be filled with an elemental semiconductor, such as Germanium.

In an embodiment of the present invention, the recessed regions may be filled to form a raised (or elevated) source/drain. In an embodiment of the present invention, the recessed regions may be overfilled to a desired thickness or height.

In an embodiment of the present invention, a dopant may be used to dope a source/drain extension (or tip) adjacent to both sides of the gate (electrode) of the transistor. In particular, Boron (Group III A of the periodic table) may be used to dope the tip or source/drain extension (SDE) in the PMOS transistor while Arsenic or Phosphorus (Group V A of the periodic table) may be used to dope the tip or source/drain extension in the NMOS transistor. The tip or source/drain extension ion implant for Boron may have an energy of 200-750 eV and a dose of (0.5-2.0) E+15 atoms/cm$^2$. The tip or source/drain extension ion implant for Phosphorus may have an energy of 400-1,500 eV and a dose of (2.5-9.0) E+14 atoms/cm$^2$.

The source/drain extension is shallow and may have a junction depth of 10-20 nm. In an embodiment of the present invention, the tip or source/drain extension may be formed with an ultra-low energy implant. The tip or source/drain implant may be an angled or tilted implant. In an embodiment of the present invention, plasma or gas phase doping may be used to form the tip or source/drain extension.

An anneal is performed after an ion implantation to activate a dopant electrically and to remove damage. The damage may include point defects and stresses in the substrate 50. In an embodiment of the present invention, the anneal is performed at a temperature selected from a range of 980-1,130 degrees Centigrade.

Annealing for a very short duration helps to minimize diffusion of dopant. In an embodiment of the present invention, the anneal is a spike anneal. In another embodiment of the present invention, the anneal is a flash anneal.

The Boron atom has a small size. Boron forms clusters interstitially and diffuses through interstitial motion. Transient-enhanced diffusion (TED) of Boron results in fast diffusion.

In an embodiment of the present invention, the Boron in the tip or the source/drain extension of the PMOS transistor may have a peak concentration of (0.7-3.0) E+20 atoms/cm$^3$. In another embodiment of the present invention, the Boron may have a peak concentration of (0.3-1.2) E+21 atoms/cm$^3$. In an embodiment of the present invention, the junction depth ($X_j$) may be 12-18 nm. In another embodiment of the present invention, the junction depth may be 18-27 nm.

In an embodiment of the present invention, the Phosphorus in the tip or the source/drain extension of the NMOS transistor may have a peak concentration of (0.6-5.0) E+20 atoms/cm$^3$. In another embodiment of the present invention, the Phosphorus may have a peak concentration of (0.5-4.0) E+21 atoms/cm$^3$. In an embodiment of the present invention, the junction depth ($X_j$) may be 8-12 nm. In another embodiment of the present invention, the junction depth may be 12-18 nm.

Formation of an ultra-abrupt semiconductor junction profile will improve performance (switching speed) of the transistor. A shallower junction depth may be achieved due to a decrease in vertical diffusion. An overlap capacitance ($C_{ov}$) between the gate (electrode) and the source/drain extension may be reduced due to a decrease in lateral diffusion. A source/drain (series) resistance may be reduced due to improved dopant activation. A drive current ($I_{on}$) for a given drain voltage may be increased due to improved dopant activation. Short channel effects (SCE) may be mitigated by improved dopant activation.

In an embodiment of the present invention, a halo implant is performed after the tip or the source/drain extension implant. In another embodiment of the present invention, the halo implant is performed before the tip or the source/drain extension implant. Reversing the sequence of implants may further reduce diffusion of Boron.

Sidewall spacers may be formed by chemical vapor deposition (CVD) along the two facing sides of the gate (electrode). The sidewall spacer may have a thickness after etch of 25-80 nm. In an embodiment of the present invention, the spacers may include two layers of dielectric material, including SiON.

The compound semiconductor in the recessed regions is heavily doped to form a raised source/drain using the gate (electrode) and the sidewall spacers as a mask. An ultra-low energy ion implantation may be used to dope the raised source/drain. Alternatively, plasma or gas phase doping may be used to dope the raised source/drain. The raised source/drain may have a junction depth of 20-40 nm.

In an embodiment of the present invention, the doped polysilicon gate (electrode) and the source/drain may be capped with an overlying layer of Nickel Silicide (with up to 3 phases: $Ni_2S$, NiS, $NiS_2$). The Nickel Silicide may have a thickness of 15-25 nm. In some cases, the gate (electrode) may be fully silicided (FUSI). In another embodiment of the present invention, a metal gate (elecxtrode) may be used (described earlier).

An interlayer dielectric (ILD) may be formed over the transistor. The ILD may include low-k (dielectric constant, k, such as 2.5-3.0) material that is formed by spin coating or chemical vapor deposition (CVD) of a material, such as organosilicate glass (OSG) or carbon-doped oxide (CDO). The ILD may include an ultra-low-k (k of 2.0-2.5) material that is porous. An air gap may also be included in the ILD. A low-k dielectric results in lower capacitance, faster switching, and faster signal transmission.

A dual Damascene scheme may be used to form multilayer interconnects to the transistor with copper metal or alloy. As needed, diffusion barrier layers and shunt layers may be included for the vias and metal lines in each layer. Between 3 and 10 layers of interconnects may be formed.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

I claim:

1. A method of forming a gate dielectric film comprising:
   providing a wafer;
   forming a buried layer over said wafer, said buried layer including an insulator;
   forming an ultra-thin body over said buried layer, said ultra-thin body comprising a compound semiconductor that is not thermally oxidizable;
   forming a channel region in said ultra-thin body, said channel region comprising multiple segments having different sizes, some of which belong to a first surface portion while others belong to a second surface portion wherein said first surface portion and said second surface portion are adjacent;
   treating a surface of said channel region;
   straining a crystal lattice in said channel region;
   forming a hybrid high-k gate dielectric film over said channel region comprising:
      forming a first dielectric material over said first surface portion, said first dielectric material being a discontinuous film;
      forming a second dielectric material over said second surface portion, said second dielectric material being a discontinuous film, and
      forming a third dielectric film over said first dielectric film and said second dielectric film wherein said third dielectric film is high-k.

2. The method of claim 1 wherein said first dielectric material has a sub-monolayer thickness.

3. The method of claim 1 wherein said first dielectric material has a monolayer thickness.

4. The method of claim 1 wherein said second dielectric film is thinner than said first dielectric film.

5. The method of claim 1 wherein said second dielectric film is thicker than said first dielectric film.

6. The method of claim 1 wherein said first dielectric film is formed with Atomic Layer Deposition (ALD).

7. The method of claim 1 wherein said second dielectric film is formed with Atomic Layer Deposition (ALD).

8. The method of claim 1 wherein said first dielectric material, said second dielectric material, and said third dielectric material are all formed with ALD in the same tool by alternately changing precursors and purging.

9. A method of forming a gate dielectric film comprising:
   providing a channel region in a transistor, said channel region comprising multiple segments having different sizes, some of which belong to a first surface portion while others belong to a second surface portion wherein said first surface portion and said second surface portion are adjacent;
   forming a hybrid high-k gate dielectric film over said channel region comprising:
      forming a first dielectric material over said first surface portion, said first dielectric material having a sub-monolayer thickness;
      forming a second dielectric material over said second surface portion, said second dielectric material having a sub-monolayer thickness, and
      forming a third dielectric film over said first dielectric film and said second dielectric film wherein said third dielectric film is high-k.

10. The method of claim 9 wherein said first dielectric film is discontinuous.

11. The method of claim 9 wherein said second dielectric film is discontinuous.

12. The method of claim 9 wherein said first dielectric material, said second dielectric material, and said third dielectric material are all formed with Atomic layer Deposition (ALD) in the same tool by changing the precursors.

* * * * *